US012772650B2

(12) United States Patent
Nitta

(10) Patent No.: US 12,772,650 B2
(45) Date of Patent: Oct. 20, 2026

(54) OPTICAL SENSOR AND MANUFACTURING METHOD THEREOF

(71) Applicant: Magnolia White Corporation, Tokyo (JP)

(72) Inventor: Jun Nitta, Tokyo (JP)

(73) Assignee: Magnolia White Corporation, Tokyo (JP)

( * ) Notice: Subject to any disclaimer, the term of this patent is extended or adjusted under 35 U.S.C. 154(b) by 438 days.

(21) Appl. No.: 18/361,378

(22) Filed: Jul. 28, 2023

(65) Prior Publication Data

US 2024/0049489 A1 Feb. 8, 2024

(30) Foreign Application Priority Data

Aug. 3, 2022 (JP) ................................ 2022-123845

(51) Int. Cl.

| | |
|---|---|
| ***H10K 39/32*** | (2026.01) |
| ***H10K 39/00*** | (2023.01) |
| ***H10K 71/50*** | (2023.01) |
| ***H10K 71/60*** | (2023.01) |
| *H10K 102/10* | (2023.01) |

(52) U.S. Cl.

CPC ........... *H10K 39/32* (2023.02); *H10K 39/501* (2023.02); *H10K 71/50* (2023.02); *H10K 71/60* (2023.02); *H10K 2102/10* (2023.02)

(58) Field of Classification Search

None

See application file for complete search history.

(56) References Cited

U.S. PATENT DOCUMENTS

2017/0358637 A1* 12/2017 Lee ....................... G06F 3/0446

FOREIGN PATENT DOCUMENTS

JP 2021-057422 A 4/2021

* cited by examiner

*Primary Examiner* — Anthony Ho

(74) *Attorney, Agent, or Firm* — Michael Best & Friedrich LLP

(57) ABSTRACT

An optical sensor includes: a lower substrate; a plurality of lower electrodes on the lower substrate; an organic photoelectric conversion layer that is provided in common on the plurality of lower electrodes and includes a hole transport layer, an active layer, and an electron transport layer in this order from the lower substrate side; a conductive adhesive that is provided between each of the plurality of lower electrodes and the organic photoelectric conversion layer and electrically connects each of the plurality of lower electrodes to the organic photoelectric conversion layer; a light-transmitting upper electrode provided on the organic photoelectric conversion layer; and a light-transmitting upper substrate provided on the upper electrode.

7 Claims, 10 Drawing Sheets

OPTICAL SENSOR AND MANUFACTURING METHOD THEREOF

CROSS-REFERENCE TO RELATED APPLICATION

The present application claims priority from Japanese Application No. 2022-123845 filed on Aug. 3, 2022, the contents of which are hereby incorporated by reference into this application.

BACKGROUND OF THE INVENTION

1. Field of the Invention

The present disclosure relates to an optical sensor and a manufacturing method thereof.

2. Description of the Related Art

In recent years, an optical sensor in which organic photodiodes (OPD) are arranged on a substrate has been known. Such a detection device is used as a biometric sensor for detecting biometric information, such as a fingerprint and a vein. The OPD includes an organic photoelectric conversion layer including a hole transport layer that transports holes, an active layer that converts received light into electric charges, and an electron transport layer that transports electrons.

In a case where the optical sensor using the OPD is of a surface-irradiation type, as disclosed in JP2021-57422A, for example, it is preferable that the hole transport layer, the active layer, and the electron transport layer are laminated in this order from the substrate side in view of the conversion efficiency.

SUMMARY OF THE INVENTION

However, when the layers included in the organic photoelectric conversion layer are formed in the order described above, it is concerned that the hole transport layer and the active layer may be damaged. That is, in the conventional manufacturing process of the OPD, layers are sequentially formed from the substrate side (i.e., from the bottom). As such, it is desirable that each of the layers of the organic photoelectric conversion layer is resistant to the conditions of forming upper layers of the organic photoelectric conversion layer. However, when the damage to the lower layer is considered, an ideal configuration of materials that prioritizes device characteristics may not be achieved.

One or more embodiments of the present invention have been conceived in view of the above, and an object thereof is to provide an optical sensor, in which a hole transport layer, an active layer, and an electron transport layer are laminated in this order from a substrate side, capable of lessening a damage to the hole transport layer and the active layer.

An optical sensor includes: a lower substrate; a plurality of lower electrodes on the lower substrate; an organic photoelectric conversion layer that is provided in common on the plurality of lower electrodes and includes a hole transport layer, an active layer, and an electron transport layer in this order from the lower substrate side; a conductive adhesive that is provided between each of the plurality of lower electrodes and the organic photoelectric conversion layer and electrically connects each of the plurality of lower electrodes to the organic photoelectric conversion layer; a light-transmitting upper electrode provided on the organic photoelectric conversion layer; and a light-transmitting upper substrate provided on the upper electrode.

BRIEF DESCRIPTION OF THE DRAWINGS

FIG. 4 is a diagram showing a partial cross section in which FIG. 3 is schematically enlarged;

DETAILED DESCRIPTION OF THE INVENTION

Embodiments of the present invention will be described below in detail with reference to the accompanying drawings. In this regard, the present invention is not to be limited to the embodiments described below, and can be changed as appropriate without departing from the spirit of the invention.

The accompanying drawings may schematically illustrate widths, thicknesses, shapes, or other characteristics of each part for clarity of illustration, compared to actual configurations. However, such a schematic illustration is merely an example and not intended to limit the present invention. In this specification and the drawings, some elements identical or similar to those shown previously are denoted by the same reference signs as the previously shown elements, and thus repetitive detailed descriptions of them may be omitted as appropriate.

Further, in the detailed description of the present invention, when a positional relationship between a component and another component is defined, if not otherwise stated, the words "on" and "below" suggest not only a case where the another component is disposed immediately on or below the component, but also a case where the component is disposed on or below the another component with a third component interposed therebetween.

Figure 1:
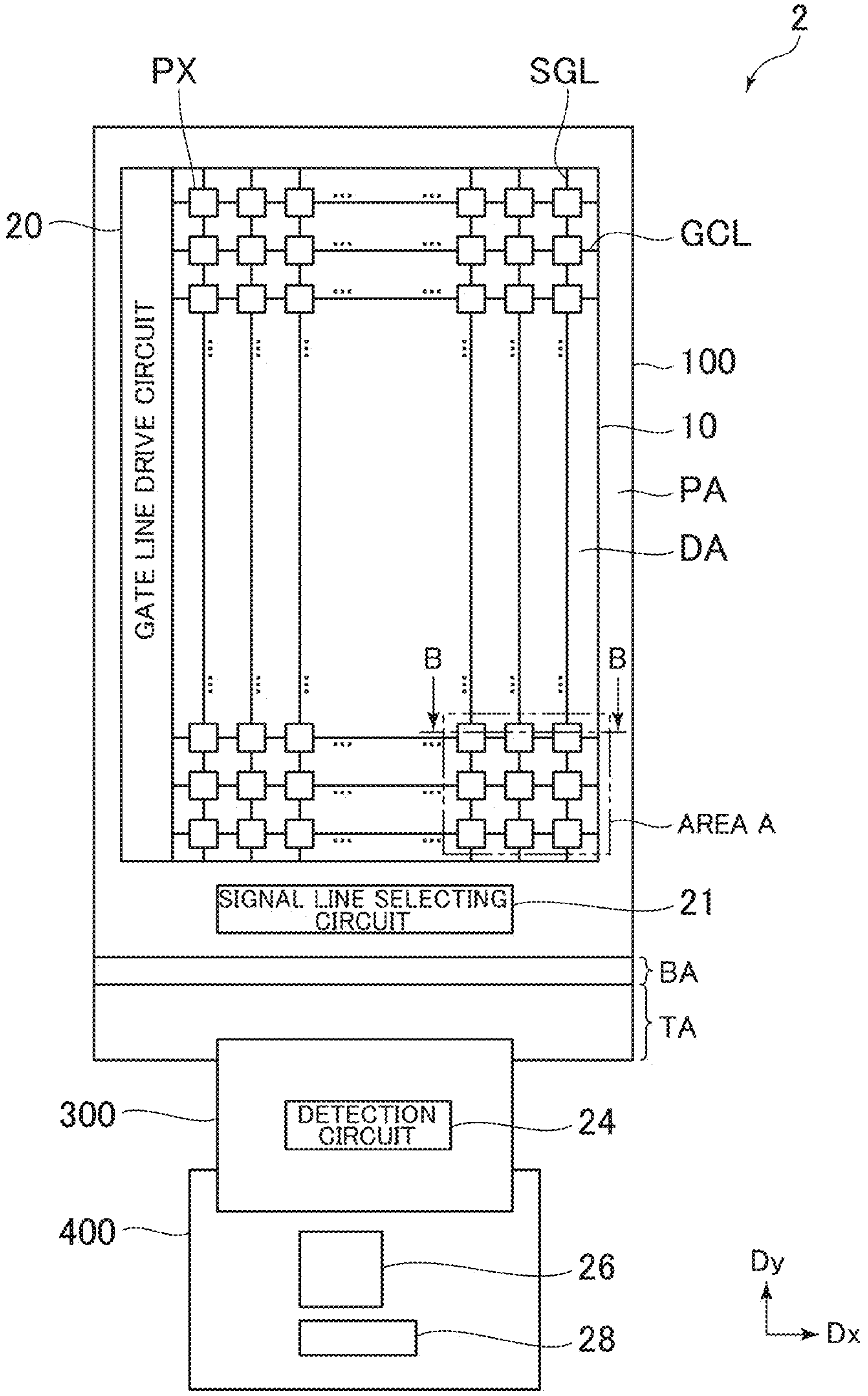
FIG. 1 is a schematic plan view of an optical sensor according to an embodiment of the present invention.

FIG. 1 is a schematic plan view of an optical sensor according to an embodiment of the present invention. As shown in FIG. 1, an optical sensor 2 includes a resin substrate 100, a sensor unit 10, a gate line drive circuit 20, a signal line selecting circuit 21, a detection circuit 24, a control circuit 26, and a power supply circuit 28. The optical sensor 2 according to the present embodiment has a surface irradiation type structure.

The resin substrate 100 is electrically connected to a control substrate 400 via a flexible printed board 300. The flexible printed board 300 includes the detection circuit 24. The control substrate 400 includes the control circuit 26 and the power supply circuit 28. The control circuit 26 is a field programmable gate array (FPGA), for example. The control circuit 26 supplies control signals to the sensor unit 10, the gate line drive circuit 20, and the signal line selecting circuit 21 so as to control the detection operation of the sensor unit 10. The power supply circuit 28 supplies a power supply voltage to the sensor unit 10, the gate line drive circuit 20, and the signal line selecting circuit 21.

The resin substrate 100 includes a detection area DA and a frame area PA. The detection area DA is an area in which the sensor unit 10 is provided. The frame area PA is an area outside the detection area DA where the sensor unit 10 is not provided. In other words, the frame area PA is an area between the end portion of the detection area DA and the end portion of the resin substrate 100.

The frame area PA has a bending area BA and a terminal area TA. The bending area BA and the terminal area TA are provided at one end of the frame area. Wires connected to the detection area DA are disposed in the bending area BA and the terminal area TA. The resin substrate 100 and the flexible printed board 300 are connected to each other in the terminal area TA.

The sensor unit 10 includes a plurality of pixels PX. The pixels PX are disposed in a matrix in the detection area DA. The pixels PX are photodiodes and respectively output electric signals corresponding to light irradiating the respective photodiodes. Each pixel PX outputs an electric signal corresponding to the light irradiating the pixel PX to the signal line selecting circuit 21 as a detection signal Vdet. In the present embodiment, the optical sensor 2 detects biological data, such as a blood vessel image of a finger and a palm, a pulse wave, a pulse, and a blood-oxygen saturation, based on the detection signal Vdet from each pixel PX. Each pixel PX performs detection in accordance with a gate drive signal Vgcl supplied from the gate line drive circuit 20.

The gate line drive circuit 20 and the signal line selecting circuit 21 are provided in the frame area PA. Specifically, the gate line drive circuit 20 is provided in an area extending along the extending direction (second direction Dy) of a signal line SGL in the frame area PA. The signal line selecting circuit 21 is provided in an area extending along the extending direction (first direction Dx) of a gate line GCL in the frame area PA and is provided between the sensor unit 10 and the bending area BA.

Figure 2:
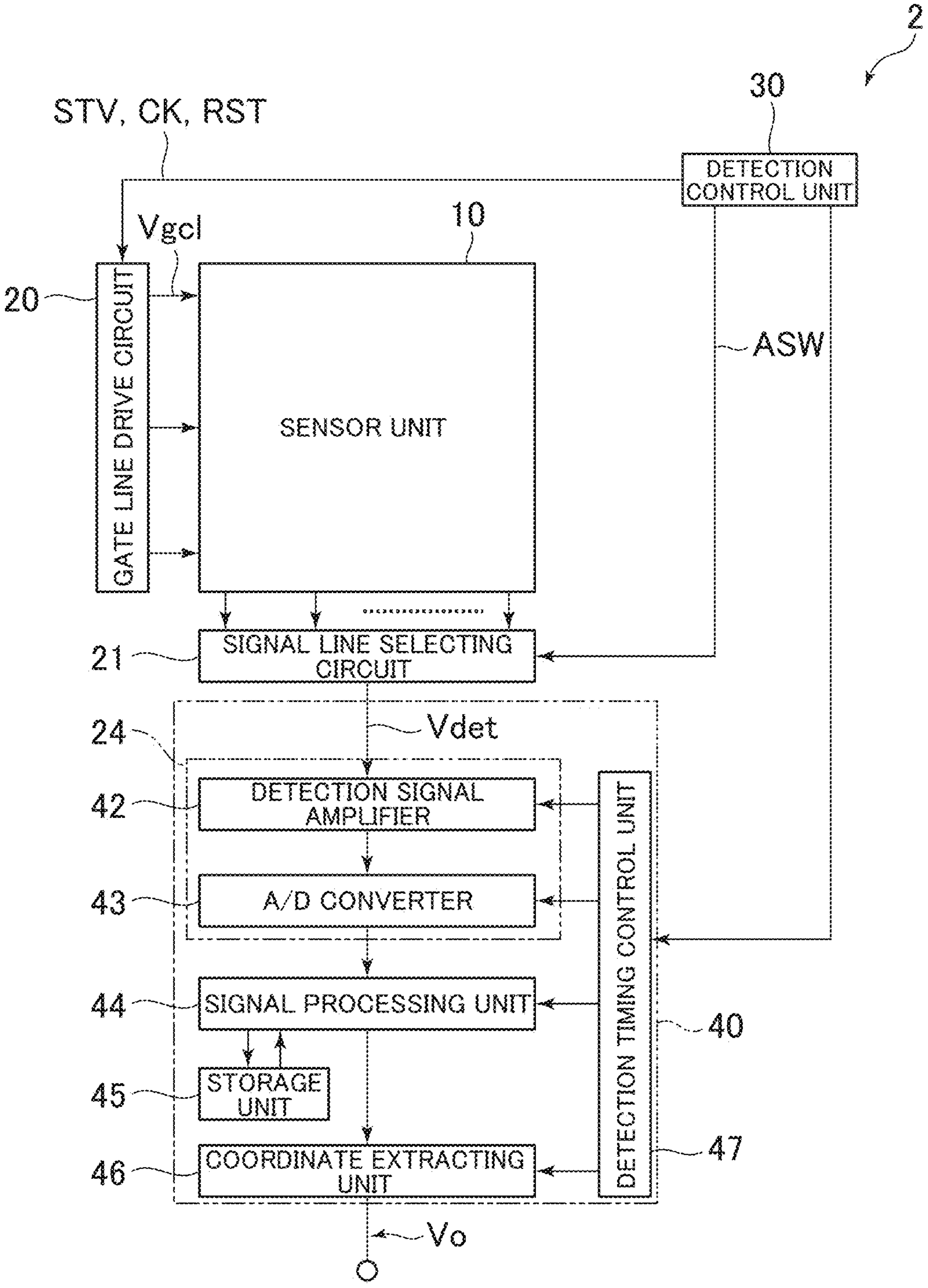
FIG. 2 is a block diagram showing an example of a configuration of the optical sensor according to the embodiment of the present invention.

FIG. 2 is a block diagram showing an example of a configuration of the optical sensor according to the embodiment of the present invention. As shown in FIG. 2, the optical sensor 2 further includes a detection control unit 30 and a detection unit 40. Some or all of the functions of the detection control unit 30 are included in the control circuit 26. Further, some or all of the functions of the detection unit 40 other than the detection circuit 24 are included in the control circuit 26.

The detection control unit 30 is a circuit that supplies control signals to the gate line drive circuit 20, the signal line selecting circuit 21, and the detection unit 40, and controls these operations. The detection control unit 30 supplies control signals, such as a start signal STV, a clock signal CK, and a reset signal RST, to the gate line drive circuit 20. The detection control unit 30 supplies control signals, such as a selection signal ASW, to the signal line selecting circuit 21.

The gate line drive circuit 20 drives the gate line GCL based on the control signals. The gate line drive circuit 20 sequentially or simultaneously selects a plurality of gate lines GCL, and supplies a gate drive signal Vgcl to the selected gate line GCL. In this manner, the gate line drive circuit 20 selects a pixel PX connected to the gate line GCL.

The signal line selecting circuit 21 is a switching circuit that sequentially or simultaneously selects a plurality of signal lines SGL. The signal line selecting circuit 21 is a multiplexer, for example. The signal line selecting circuit 21 connects the selected signal line SGL with the detection circuit 24 based on the selection signal ASW supplied from the detection control unit 30. This enables the signal line selecting circuit 21 to output a detection signal Vdet of the pixel PX to the detection unit 40.

The detection unit 40 includes the detection circuit 24, a signal processing unit 44, a storage unit 45, a coordinate extracting unit 46, and a detection timing control unit 47. The detection timing control unit 47 controls the detection circuit 24, the signal processing unit 44, and the coordinate extracting unit 46 to operate in synchronization based on the control signal supplied from the detection control unit 30.

The detection circuit 24 is an analog front end circuit (AFE), for example. The detection circuit 24 is a signal processing circuit having at least functions of a detection signal amplifier 42 and an A/D converter 43. The detection signal amplifier 42 amplifies the detection signal Vdet. The A/D converter 43 converts an analog signal from the detected signal amplifier 42 into a digital signal.

The signal processing unit 44 is a logic circuit that detects a predetermined physical quantity entered into the sensor unit 10 based on the output signal of the detection circuit 24. When a detection target, such as a finger and a palm, comes into contact with or is close to the detection surface, the signal processing unit 44 detects unevenness of the surface of the finger and the palm based on the signal from the detection circuit 24. Further, the signal processing unit 44 detects biological data, such as a blood vessel image of a finger and a palm, a pulse wave, a pulse, and a blood-oxygen saturation, based on a signal from the detection circuit 24.

The storage unit 45 temporarily stores the signal calculated by the signal processing unit 44. The storage unit 45 may be a random access memory (RAM) or a register circuit, for example.

The coordinate extracting unit 46 is a logic circuit that obtains detection coordinates of unevenness of a surface of a finger and a palm, for example, when the signal processing unit 44 detects contact or approach of the finger or the palm. The coordinate extracting unit 46 is a logic circuit that obtains detection coordinates of blood vessels of a finger and a palm, for example. The coordinate extracting unit 46 combines detection signals Vdet from the respective pixels PX of the sensor unit 10 to generate two-dimensional information indicating the shape of the unevenness of the surface of the finger and the palm, for example. The coordinate extracting unit 46 may not calculate the detection coordinates but output the detection signal Vdet as the sensor output Vo.

Figure 3:
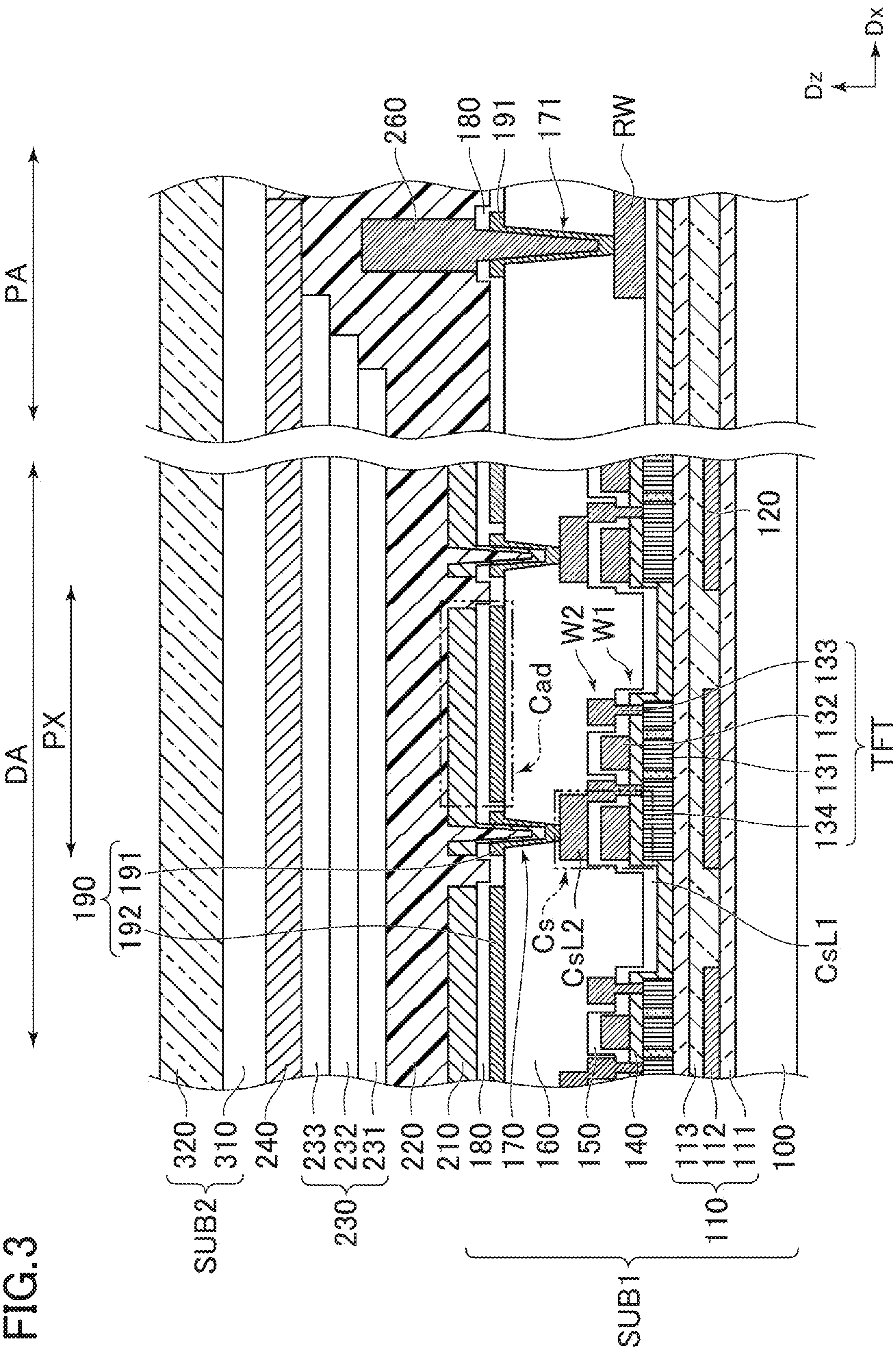
FIG. 3 is a partial sectional view of the optical sensor taken along the line B-B of FIG. 1.

FIG. 3 is a partial sectional view of the optical sensor 2 taken along the line B-B of FIG. 1. In FIG. 3, a part of the detection area DA and a part of the frame area PA are shown in a cross-sectional view. As described above, the detection area DA includes a plurality of pixels PX, and the frame area PA includes the bending area BA and the terminal area TA.

Each bottom PX includes a corresponding one of the pixel electrodes 210 and a corresponding one of the thin film transistors TFT.

Figure 4:
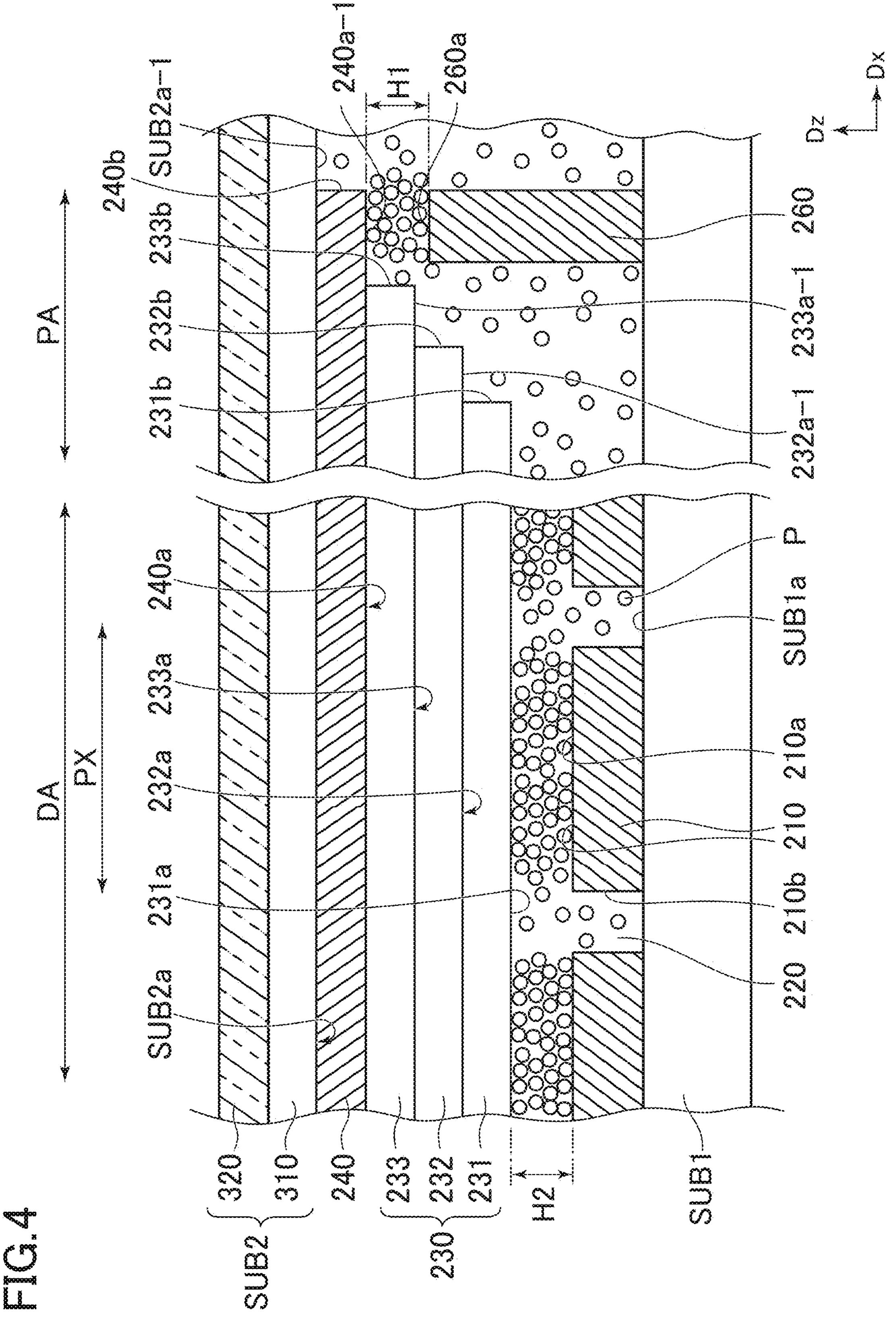

FIG. 3 shows the cut surface in the first direction Dx. When the detection area DA is cut in the second direction Dx, the same cross-sectional structure as in FIG. 4 is observed. In FIG. 3, hatching of some layers is omitted for clarity of the cross-sectional structure (the same applies to FIGS. 4, 6, 7). In the following, the cross-sectional structure shown in FIG. 3 will be described in order from the lower layer. The lamination direction of the layers will be referred to as a third direction Dz.

A barrier inorganic film 110 is laminated on the resin substrate 100. The resin substrate 100 is made of polyimide. However, any resin material may be used if the substrate has sufficient flexibility as the sheet-type optical detection device. The barrier inorganic film 110 has a three-layered structure of a first inorganic film (e.g., silicon oxide film) 111, a second inorganic film (e.g., silicon nitride film) 112, and a third inorganic film (e.g., silicon oxide film) 113. The first inorganic film 111 is provided to improve the adhesion to the substrate, the second inorganic film 112 is provided to block moisture and impurities from the outside, and the third inorganic film 113 is provided to prevent hydrogen atoms contained in the second inorganic film 112 from diffusing to the semiconductor layer 131, but the structure is not particularly limited thereto. The structure may include an additional layer, or may be formed of one layer or two layers.

An additional film 120 may be formed at a portion where the thin film transistor TFT to be described later is formed. The additional film 120 prevents a change in characteristics of the thin film transistor TFT due to penetration of light from the back surface of the channel of the thin film transistor TFT or provides a predetermined potential by being formed of a conductive material, thereby providing a back gate effect to the thin film transistor TR. In this case, the first inorganic film 111 is formed, and then the additional film 120 is formed in an island shape in accordance with a portion where the thin film transistor TFT is formed. Subsequently, the second inorganic film 112 and the third inorganic film 113 are laminated so that the additional film 120 is sealed in the barrier inorganic film 110. In this regard, the present invention is not limited thereto, and the additional film 120 may be first formed on the resin substrate 100 and then the barrier inorganic film 110 may be formed.

A thin film transistor TFT is formed on the barrier inorganic film 110 for each pixel PX. The thin film transistor TFT includes a semiconductor layer 131, a gate electrode 132, a source electrode 133, and a drain electrode 134. In this case, a polysilicon thin film transistor is taken as an example, and only an N-channel transistor is shown, although a P-channel transistor may be simultaneously formed. The semiconductor layer 131 of the thin film transistor TFT has a structure in which a low-concentration impurity region or an intrinsic semiconductor region is provided between a channel region and a source/drain region. The gate electrode 132 is a portion where the gate line GCL is electrically connected to the semiconductor layer 131 in each pixel PX. Similarly, the source electrode 133 is a portion where the signal line SGL is electrically connected to the semiconductor layer 131 in each pixel PX.

A gate insulating film 140 is provided between the semiconductor layer 131 and the gate electrode 132. In this case, a silicon oxide film is used as the gate insulating film 140. The gate electrode 132 is a part of the first wiring layer W1 formed of MoW. The first wiring layer W1 includes a first holding capacitance line CsL1 in addition to the gate electrode 132. A part of the holding capacitor Cs is formed between the first holding capacitance line CsL1 and the semiconductor layer 131 (source/drain regions) via the gate insulating film 140.

An interlayer insulating film 150 is formed on the gate electrode 132. The interlayer insulating film 150 has a structure in which a silicon nitride film and a silicon oxide film are laminated. The films from the barrier inorganic film 110 to the interlayer insulating film 150 are patterned and removed at the area corresponding to the bending area BA (not shown). The polyimide forming the resin substrate 100 is exposed in the area corresponding to the bending area BA (not shown). When the barrier inorganic film 110 is patterned to be removed, the surface of the polyimide may be partially eroded or lost.

A wiring pattern is formed under each of the step at the edge of the interlayer insulating film 150 and the step at the edge of the barrier inorganic film 110 (not shown). A routing wire RW to be formed in the next process is disposed over the wiring pattern when crossing the steps (not shown). For example, the gate electrode 132 is disposed between the interlayer insulating film 150 and the barrier inorganic film 110, and the additional film 120 is disposed between the barrier inorganic film 110 and the resin substrate 100. As such, the wiring pattern is formed using these layers.

A second wiring layer W2, which includes the source electrode 133, the drain electrode 134, and a portion serving as the routing wire RW, is formed on the interlayer insulating film 150. In this case, a three-layered structure of Ti, Al, and Ti is employed. The first holding capacitance line CsL1 (a part of the first wiring layer W1) and the second holding capacitance line CsL2 (a part of the second wiring layer W2) form another part of the holding capacitor Cs via the interlayer insulating film 150. The routing wire RW extends to the terminal area TA via the bending area BA and forms a terminal portion T to which the flexible printed board 300 is connected, for example (not shown).

The routing wire RW is formed so as to reach the terminal portion T across the bending area BA, and thus crosses the steps of the interlayer insulating film 150 and the barrier inorganic film 110 (not shown). As described above, the wiring pattern formed by the additional film 120, for example, is formed in the steps. As such, even if the routing wire RW is disconnected at the recess of the step, the electrical connection can be maintained by contacting the wiring pattern.

A flattening film 160 is disposed so as to cover the source electrode 133, the drain electrode 134, and the interlayer insulating film 150. The flattening film 160 is made of resin, such as photosensitive acryl, because such a material is superior in surface flatness to an inorganic insulating material formed by CVD (chemical vapor deposition), for example. The flattening film 160 is removed in a pixel contact portion 170, a common electrode contact portion 171, the bending area BA, and the terminal area TA.

A transparent conductive film 190 made of indium tin oxide (ITO) is formed on each pixel PX on the flattening film 160. The transparent conductive film 190 includes a first transparent conductive film 191 and a second transparent conductive film 192, which are separated from each other.

In the pixel contact portion 170, the first transparent conductive film 191 covers the second wiring layer W2, a surface of which is exposed by removal of the flattening film 160. An inorganic insulating film (silicon nitride film) 180 is provided on the flattening film 160 so as to cover the first transparent conductive film 191. The inorganic insulating film 180 is open to the pixel contact portion 170.

The second transparent conductive film 192 is disposed below a lower electrode 210 (further below the inorganic insulating film 180) to be described later and next to the pixel contact portion 170. The second transparent conductive film 192, the inorganic insulating film 36, and the lower electrode 210 overlap one another and form an additional capacitance Cad.

A third transparent conductive film may be formed on the surface of the terminal portion (not shown). The third transparent conductive film formed on the surface of the terminal portion may be provided for the purposes of protecting the exposed wiring portion from a damage in subsequent steps.

The laminated structure from the resin substrate 100 to the inorganic insulating film 180 (hereinafter referred to as a lower substrate SUB1) has been discussed. In the following, referring to FIGS. 3 and 4, the structure of the layers above the lower substrate SUB1 will be described. FIG. 4 shows a partial cross section in which FIG. 3 is schematically enlarged.

A plurality of lower electrodes 210 adjacent to each other are provided on the lower substrate SUB1 (more specifically, inorganic insulating film 180). Specifically, the lower electrodes 210 are respectively provided for the pixels PX so as to be electrically connected to the drain electrode 134 through the opening of the inorganic insulating film 180 in the pixel contact portion 170. The lower electrode 210 is formed as a reflective electrode and has a three-layered structure of an indium zinc oxide film, an Ag film, and an indium zinc oxide film. An indium tin oxide film may be used instead of the indium zinc oxide film. The lower electrode 210 extends laterally from the pixel contact portion 170 and above the thin film transistor TFT.

An organic photoelectric conversion layer 230 is provided in common between a plurality of pixels PX (i.e., a plurality of lower electrodes 210) on the lower electrodes 210. That is, the organic photoelectric conversion layer 230 is provided over the entire detection area DA.

The organic photoelectric conversion layer 230 includes a hole transport layer 231, an active layer 232, and an electron transport layer 233 in this order from the lower substrate SUB1 side. More specifically, the organic photoelectric conversion layer 230 has a structure in which the hole transport layer 231, the active layer 232, and the electron transport layer 233 are laminated in this order from the lower substrate SUB1 side. The hole transport layer 231 transports holes, and the charge transport layer 233 transports electrons. The active layer 232 converts light incident on the optical sensor 2 into electric charges.

A conductive adhesive 220 is provided between each of the lower electrodes 210 and the organic photoelectric conversion layer 230. Specifically, the conductive adhesive 220 is provided so as to fill between each of the lower electrodes 210 and the organic photoelectric conversion layer 230. More specifically, the conductive adhesive 220 is provided so as to fill between upper surfaces 210*a* of the respective lower electrodes 210 and a lower surface 231*a* of the hole transport layer. Further, the conductive adhesive 220 is provided so as to fill between an upper surface SUB1*a* of the lower substrate SUB1 and a lower surface 231*a* of the hole transport layer. Further, the conductive adhesive 220 is provided so as to fill between side portions 210*b* of adjacent lower electrodes 210. As will be described later, the conductive adhesive 220 may partially have a defect, such as a gap or impurities included therein, if each of the lower electrodes 210 is electrically connected to the organic photoelectric conversion layer 230.

The conductive adhesive 220 electrically connects each of the plurality of lower electrodes 210 and the organic photoelectric conversion layer 230. Specifically, the conductive adhesive 220 includes conductive particles P. The conductive particles P are aggregated between the upper surfaces 210*a* of the respective lower electrodes 210 and the lower surface 231*a* of the hole transport layer. This allows each lower electrode 210 to electrically connect to the organic photoelectric conversion layer 230. In this regard, "aggregation" of the conductive particles P indicates that the conductive particles P are gathered between members such that a certain member and other member are electrically connected to each other.

The conductive adhesive 220 is an anisotropic conductive adhesive. Specifically, the conductivity of the conductive adhesive 220 in a direction perpendicular to the lower substrate SUB (here, third direction Dz) is greater than the conductivity of the conductive adhesive 220 in a direction parallel to the lower substrate SUB1 (here, first direction Dx).

More specifically, the conductivity of the conductive adhesive 220 between each of the lower electrodes 210 and the organic photoelectric conversion layer 230 is greater than the conductivity of the conductive adhesive 220 between the upper surface SUB1*a* of the lower substrate SUB1 and the lower surface 231*a* of the hole transport layer and the conductivity of the conductive adhesive 220 between the side portions 210*b* of the adjacent lower electrodes 210. In other words, the density of the conductive particles P between each of the lower electrodes 210 and the organic photoelectric conversion layer 230 is greater than the density of the conductive particles P between the upper surface SUB1*a* of the lower substrate SUB1 and the lower surface 231*a* of the hole transport layer and the density of the conductive particles P between the side portions 210*b* of the adjacent lower electrodes 210.

In the present embodiment, the conductive particles P included in the conductive adhesive 220 have a self-aligning nature. That is, as will be described later, when each of the lower electrodes 210 and the organic photoelectric conversion layer 230 are bonded together by the conductive adhesive 220, the conductive particles P spontaneously aggregate between each lower electrode 210 and the organic photoelectric conversion layer 230. This configuration eliminates the need of the pressure bonding in a heated state in the bonding step (see FIG. 6D) using the conductive adhesive 220, and thus serves to manufacture the optical sensor 2 under milder conditions. The conductive particles P included in the conductive adhesive 220 may not have a self-aligning nature.

The number of conductive particles P for one lower electrode 210 is preferably plural in view of ensuring stable conduction. Specifically, the number of conductive particles P for one lower electrode 210 is preferably at least twenty. That is, when the size of the conductive particle P is 1 μm in diameter, the area of the upper surface 210*a* of the lower electrode 210 is preferably at least 20 $\mu m^2$. When the size of a conductive particle P is 3 μm, the area of the upper surface 210*a* of the lower electrode 210 is preferably at least 180 $\mu m^2$. Further, when the size of a conductive particle P is 5 μm in diameter, the area of the upper surface 210*a* of the lower electrode 210 is preferably at least 500 $\mu m^2$. As described above, when the size of a conductive particle P is fpm to 5 μm, the area density of the conductive particles P on the upper surface 210*a* of the lower electrode 210 (the number of the conductive particles P per unit area on the upper surface 210*a* of the lower electrode 210) is preferably 0.04 to 1 per μm$^2$.

More preferably, the size of a conductive particle P is 3 μm or less. In other words, the area density of the conductive particles P on the upper surface 210*a* of the lower electrode 210 is more preferably 0.1 to 1 per μm$^2$. That is, if a conductive particle P is too large, the contact area between the conductive particles P and the lower surface 231*a* of the hole transport layer 231 may be reduced, resulting in unstable conduction. As such, smaller size of a conductive particle P is more desirable.

An upper electrode 240 is provided in common between a plurality of pixels PX (i.e., a plurality of lower electrodes 210) on the organic photoelectric conversion layer 230. That is, the upper electrode 240 is provided over the entire detection area DA similarly to the organic photoelectric conversion layer 230. More specifically, the upper electrode 240 is laminated on the organic photoelectric conversion layer 230. In the present embodiment, the optical sensor 2 has a surface irradiation type structure, and thus the upper electrode 240 has a light-transmitting property. Specifically, after PEDOT:PSS is formed on the surface in contact with the organic photoelectric conversion layers 230, the upper electrode 240 is formed using a metallic material, such as Ag and Al, as a thin film through which the incident light is transmitted. The upper electrode 240 is formed over the organic photoelectric conversion layer 230 provided in the detection area DA and the common electrode contact portion 171 provided in the frame area PA. In the common electrode contact portion 171, the upper electrode 240 is electrically connected to the routing wire RW and eventually extracted to the terminal portion T.

A light-transmitting upper substrate SUB2 is provided on the upper electrode 240. More specifically, the upper substrate SUB2 is laminated on the upper electrode 240.

The upper substrate SUB2 includes a light-transmitting sealing layer 310 and a light-transmitting substrate 320 laminated on the sealing layer 310 in this order from the bottom (i.e., from the lower substrate SUB1). One of the functions of the sealing layer 310 is protecting the organic photoelectric conversion layer 230 from moisture entering from the outside, and is required to have a high gas barrier property. In the present embodiment, the sealing layer 310 has a laminate structure of a silicon nitride film, an organic resin, and a silicon nitride film as a laminate structure including a silicon nitride film. A silicon oxide film or an amorphous silicon layer may be provided between the silicon nitride film and the organic resin for the purpose of improving adhesion. However, such a film is provided on the light-receiving surface side, it is thus preferable that the materials do not absorb or otherwise act on light of the wavelength to be detected. In the present embodiment, the light-transmitting substrate 320 is a glass substrate. The light-transmitting substrate 320 may be formed of a light-transmitting resin. Alternatively, the light-transmitting substrate 320 may be formed of a flexible material according to the usage of the optical sensor 2.

Figure 5:
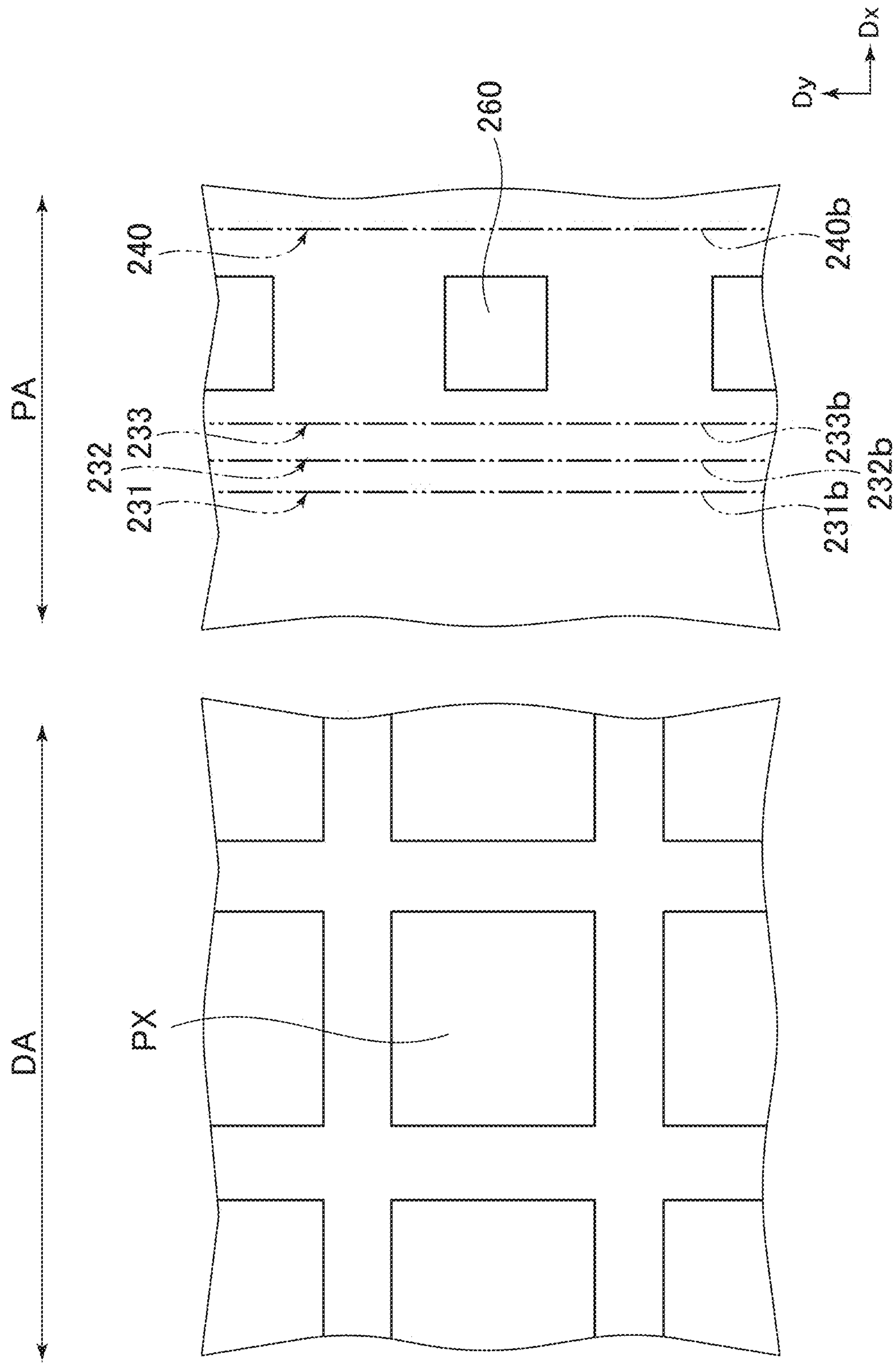
FIG. 5 is a partial plan view of an area A surrounded by a broken line in FIG. 1 and schematically enlarged.

In the following, referring to FIG. 5, a detailed structure around the frame area PA shown in FIGS. 3 and 4 will be described. FIG. 5 shows a partial plan view of the area A surrounded by a broken line in FIG. 1 and schematically enlarged.

As shown in FIGS. 4 and 5, an end portion 240*b* of the upper electrode 240 is located closer to the end portion of the lower substrate SUB1 than an end portion 233*b* of the electron transport layer 233, and closer to the display area DA than the end portion of the lower substrate SUB1. The end portion 233*b* of the electron transport layer 233 is located closer to the end portion of the lower substrate SUB1 than the end portion 232*b* of the active layer 232. Further, the end portion 232*b* of the active layer 232 is located closer to the end portion of the lower substrate SUB1 than the end portion 231*b* of the hole transport layer 231.

In other words, the lower surface SUB2*a* of the upper substrate SUB2 has an exposed surface SUB2*a*-1 that is not covered by the upper electrode 240. Similarly, the lower surface 240*a* of the upper electrode 240 has an exposed surface 240*a*-1 that is not covered by the electron transport layer 233. The lower surface 233*a* of the electron transport layer 233 has an exposed surface 233*a*-1 that is not covered by the active layer 232. Further, the lower surface 232*a* of the active layer 232 has an exposed surface 232*a*-1 that is not covered by the hole transport layer 231.

The conductive adhesive 220 is provided to fill between the exposed surface SUB2*a*-1 of the upper substrate SUB2 and the upper surface SUB1*a* of the lower substrate SUB1. Similarly, the conductive adhesive 220 is provided so as to fill between the exposed surface 240*a*-1 of the upper electrode 240 and the upper surface SUB1*a* of the lower substrate SUB1. Further, the conductive adhesive 220 is provided so as to fill between the exposed surface 233*a*-1 of the electron transport layer 233 and the upper surface SUB1*a* of the lower substrate SUB1. Further, the conductive adhesive 220 is provided so as to fill between the exposed surface 232*a*-1 of the active layers 232 and the upper surface SUB1*a* of the lower substrate SUB1.

The conductivity of the conductive adhesive 220 between each of the lower electrodes 210 and the organic photoelectric conversion layer 230 is greater than the conductivity of the conductive adhesive 220 between the exposed surface SUB2*a*-1 of the upper substrate SUB2 and the upper surface SUB1*a* of the lower substrate SUB1. Similarly, the conductivity of the conductive adhesive 220 between each of the lower electrodes 210 and the organic photoelectric conversion layer 230 is greater than the conductivity of the conductive adhesive 220 between the exposed surface 240*a*-1 of the upper electrode 240 and the upper surface SUB1*a* of the lower substrate SUB1. Further, the conductivity of the conductive adhesive 220 between each of the lower electrodes 210 and the organic photoelectric conversion layer 230 is greater than the conductivity of the conductive adhesive 220 between the exposed surface 233*a*-1 of the electron transport layer 233 and the upper surface SUB1*a* of the lower substrate SUB1. Further, the conductivity of the conductive adhesive 220 between each of the lower electrodes 210 and the organic photoelectric conversion layer 230 is greater than the conductivity of the conductive adhesive 220 between the exposed surface 232*a*-1 of the active layer 232 and the upper surface SUB1*a* of the lower substrate SUB1.

More specifically, the density of the conductive particles P between each of the lower electrodes 210 and the organic photoelectric conversion layer 230 is greater than the density of the conductive particles P between the exposed surface SUB2*a*-1 of the upper substrate SUB2 and the upper surface SUB1*a* of the lower substrate SUB1. Similarly, the density of the conductive particles P between each of the lower electrodes 210 and the organic photoelectric conversion layer 230 is greater than the density of the conductive particles P between the exposed surface 240*a*-1 of the upper electrode 240 and the upper surface SUB1*a* of the lower substrate SUB1. The density of the conductive particles P between each of the plurality of lower electrodes 210 and the organic photoelectric conversion layer 230 is greater than the density of the conductive particles P between the exposed surface 233*a*-1 of the electron transport layer 233 and the upper surface SUB1*a* of the lower substrate SUB1. Further, the density of the conductive particles P between each of the lower electrodes 210 and the organic photoelectric conversion layer 230 is larger than the density of the conductive particles P between the exposed surface 232*a*-1 of the active layer 232 and the upper surface SUB1*a* of the lower substrate SUB1.

In the frame area PA, a conductive layer 260 is provided on the lower substrate SUB1 (more specifically, inorganic insulating film 180) so as to electrically connect the upper electrode 240 with the lower substrate SUB1. The conductive adhesive 220 is provided between the conductive layer 260 and the upper electrode 240, which are electrically connected by the conductive adhesive 220. In the common electrode contact portion 171, the conductive layer 260 and the routing wiring RW of the lower substrate SUB1 are electrically connected to each other, and the upper electrode 240 and the routing wiring RW of the lower substrate SUB1 are thereby electrically connected to each other. Specifically, the conductive adhesive 220 is provided so as to fill between the upper surface 260*a* of the conductive layer 260 and the lower surface 240*a* of the upper electrode 240.

As shown in FIG. 5, a plurality of conductive layers 260 are provided on each side of the lower substrate SUB1 in a plan view. More specifically, as shown in FIG. 5, the conductive layers 260 are provided on each side of the lower substrate SUB1 for each row in which a plurality of pixels PX are arranged in the first directional Dx in a plan view. Similarly, each conductive layer 260 is provided on each side of the lower substrate SUB1 also for each column in which a plurality of pixels PX are arranged in the second directional Dy in a plan view (not shown).

In a cross-sectional view, the distance between the conductive layer 260 and the upper electrode 240 is equal to the distance between the lower electrode 210 and the hole transport layer 231. Specifically, in a cross-sectional view, a distance H1 between the upper surface 260*a* of the conductive layer 260 and the exposed surface 240*a*-1 of the upper electrode 240 is equal to a distance H2 between the upper surface 210*a* of the lower electrode 210 and the lower surface 231*a* of the hole transport layer 231. That is, the conductivity of the conductive adhesive 220 between the upper surface 260*a* of the conductive layer 260 and the exposed surface 240*a*-1 of the upper electrode 240 is equal to the conductivity of the conductive adhesive 220 between the upper surface 210*a* of the lower electrode 210 and the lower surface 231*a* of the hole transport layer 231. More specifically, the density of the conductive particles P between the upper surface 260*a* of the conductive layer 260 and the exposed surface 240*a*-1 of the upper electrode 240 is equal to the density of the conductive particles P between the upper surface 210*a* of the lower electrode 210 and the lower surface 231*a* of the hole transport layer 231. Such a configuration secures stable conduction.

In a case where the upper substrate SUB2 is made of a flexible material, the distance between the conductive layer 260 and the upper electrode 240 may be greater than the distance between the lower electrode 210 and the hole transport layer 231.

In the following, a manufacturing process of the optical sensor 2 according to the present embodiment will be described with reference to FIG. 6 (FIGS. 6A to 6D). FIG. 6 is a schematic cross-sectional view of the optical sensor in the manufacturing process according to the embodiment of the present invention.

Figure 6A:
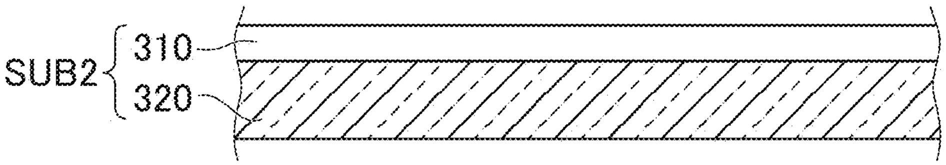
FIG. 6A is a schematic cross-sectional view of the optical sensor in the manufacturing process according to the embodiment of the present invention.
Figure 6B:
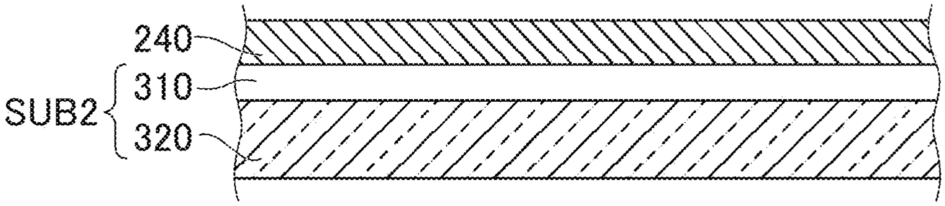
FIG. 6B is a schematic cross-sectional view of the optical sensor in the manufacturing process according to the embodiment of the present invention.
Figure 6C:
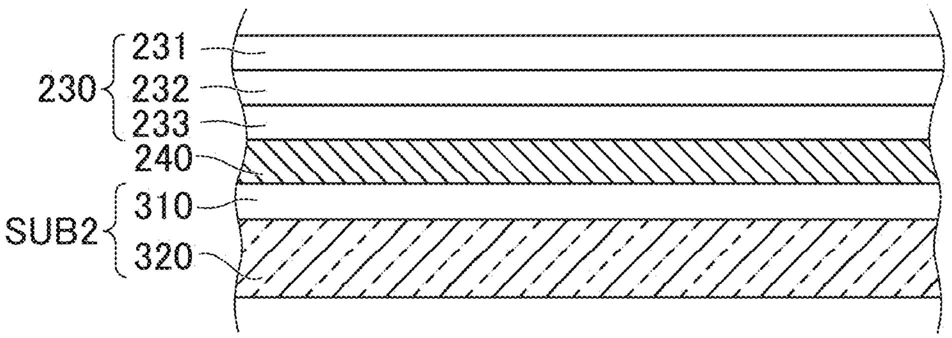
FIG. 6C is a schematic cross-sectional view of the optical sensor in the manufacturing process according to the embodiment of the present invention.

First, a sealing layer 310 is formed on a light-transmitting substrate 320 to obtain an upper substrate SUB2 (light-transmitting first substrate) (FIG. 6A). Subsequently, an upper electrode 240 (light-transmitting conductive film) is formed on the upper substrate SUB2 (FIG. 6B). As described with reference to FIGS. 4 and 5, the upper electrode 240 is formed such that an end portion 240*b* of the upper electrode 240 is located closer to the displaying area DA than an end portion of the lower substrate SUB1.

Next, an organic photoelectric conversion layer 230 (organic photoelectric conversion film) including an electron transport layer 233 (electron transport film), an active layer 232 (active film), and a hole transport layer 231 (hole transport film) in this order from the upper substrate SUB2 side (FIG. 6C) is formed on the upper electrode 240.

As described with reference to FIGS. 4 and 5, the electron transport layer 233 is formed such that the end portion 240*b* of the upper electrode 240 is located closer to the end portion of the lower substrate SUB1 than the end portion 233*b* of the electron transport layer 233. Further, the active layer 232 is formed such that the end portion 233*b* of the electron transport layer 233 is located closer to the end portion of the lower substrate SUB1 than the end portion 232*b* of the active layer 232. Further, the hole transport layer 231 is formed such that the end portion 232*b* of the active layer 232 is located closer to the end portion of the lower substrate SUB1 than the end portion 231*b* of the hole transport layer 231. Such a manufacturing method can prevent the active layer 232 and the upper electrode 240 from being in contact with each other, or leakage of charge due to contact between the hole transport layer 231 and the electron transport layer 233, for example.

Figure 6D:
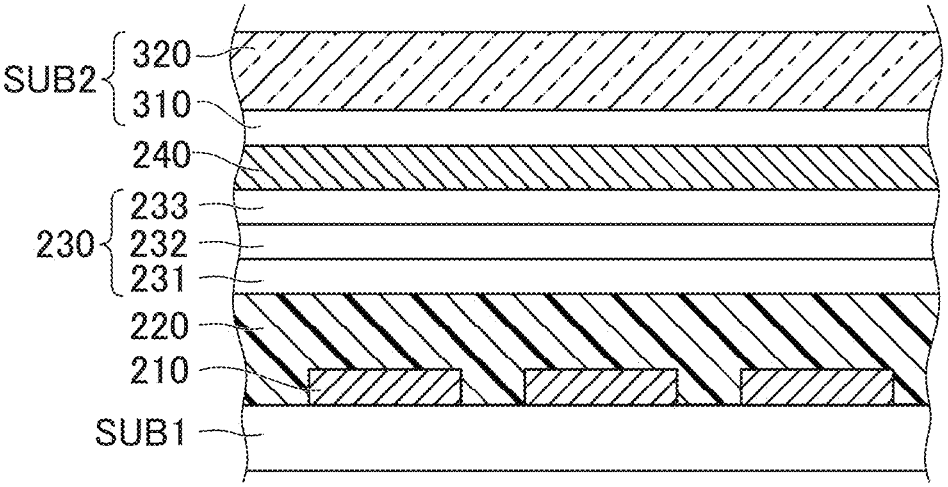
FIG. 6D is a schematic cross-sectional view of the optical sensor in the manufacturing process according to the embodiment of the present invention.

Subsequently, the upper substrate SUB2 and the lower substrate SUB1 (second substrate) on which the lower electrodes 210 (a plurality of electrodes) are provided are bonded together by the conductive adhesive 220 (FIG. 6D). At this time, each of the lower electrodes 210 and the organic photoelectric conversion layer 230 are electrically connected to each other via the conductive adhesive 220. For the bonding, the conductive adhesive 220 is applied to the upper substrate SUB2, and the lower substrate SUB1 is bonded to the upper substrate SUB2. Needless to say, the conductive adhesive 220 may be applied to the lower substrate SUB1, and the upper substrate SUB2 may be bonded to the lower substrate SUB1.

The manufacturing method shown in FIG. 6 can prevent a damage to the hole transport layer and the active layer when manufacturing an optical sensor in which the hole transport layer, the active layer, and the electron transport layer are laminated in this order from the substrate side. That is, in the manufacturing method shown in FIG. 6, each layer of the organic photoelectric conversion layer can be formed in the order opposite to the order of the conventional film forming step. As such, when the hole transport layer, the active layer, and the electron transport layer are formed in this order from the substrate side, a damage to the hole transport layer and the active layer can be lessened.

Figure 7:
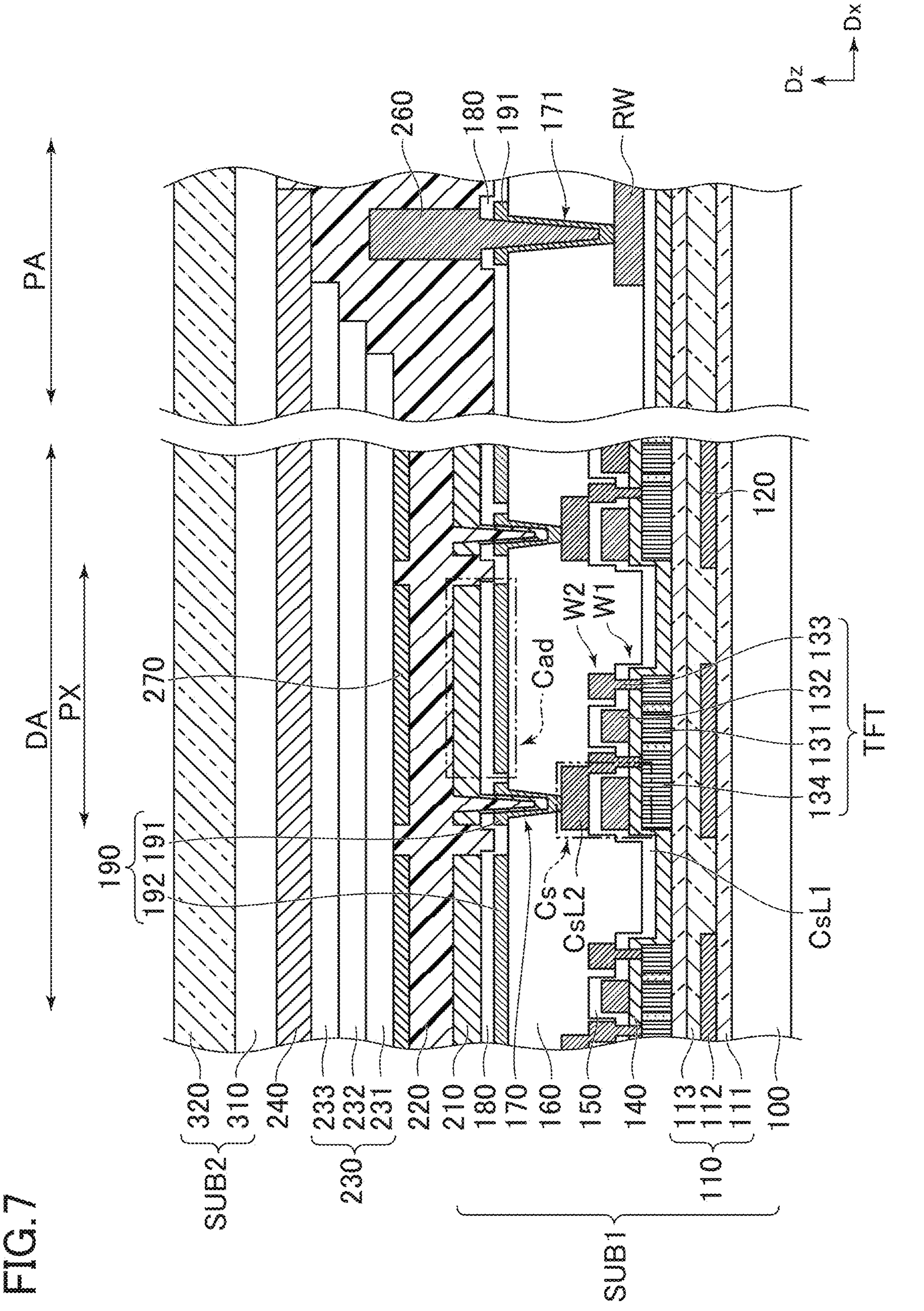
FIG. 7 is a partial sectional view of the optical sensor taken along the line B-B of FIG. 1 according to a modification.

Finally, referring to FIG. 7, a modification of the present embodiment will be described. FIG. 7 is a partial sectional view of the optical sensor taken along the line B-B of FIG. 1 according to a modification. Details of the configuration that are already explained will be omitted.

An auxiliary electrode film 270 is further provided between each of the lower electrodes 210 and the hole transport layer 231 so as to be in contact with the hole transport layer 231 and overlap with each of the lower electrodes 210 in a plan view. Such a configuration secures more stable conduction. In the present modification, a plurality of auxiliary electrode films 270 are provided so as to correspond to each of the pixel electrodes 210, but the auxiliary electrode film 270 may be simply a solid film.

The present invention is not limited to the above embodiment, and various modifications can be made. For example, a replacement can be made with a configuration that is substantially the same as the configuration shown in the above-described embodiment, a configuration that exhibits the same operational effect, or a configuration that can achieve the same object.

Within the scope of the idea of the present invention, those skilled in the art can come up with various changes and modifications and it will be understood that these changes and modifications also fall into the scope of the present invention. For example, in each of the above-described embodiments, addition, deletion or redesign of a component, or addition, omission or condition change of a process, which are appropriately made by a person skilled in the art, are also included within the scope of the present invention as long as they remain the gist of the present invention.

The invention claimed is:

1. An optical sensor comprising:

a lower substrate;

a plurality of lower electrodes on the lower substrate;

an organic photoelectric conversion layer that is provided in common on the plurality of lower electrodes and includes a hole transport layer, an active layer, and an electron transport layer in this order from the lower substrate side;

a conductive adhesive that is provided between each of the plurality of lower electrodes and the organic photoelectric conversion layer and electrically connects each of the plurality of lower electrodes to the organic photoelectric conversion layer;

a light-transmitting upper electrode provided on the organic photoelectric conversion layer; and a light-transmitting upper substrate provided on the upper electrode, wherein an end portion of the electron transport layer is located closer to an end portion of the lower substrate than an end portion of the active layer, and the end portion of the active layer is located closer to the end portion of the lower substrate than an end portion of the hole transport layer.

2. The optical sensor according to claim 1, wherein the conductive adhesive is an anisotropic conductive adhesive.

3. The optical sensor according to claim 2, wherein the conductive adhesive includes a self-aligning conductive particle.

4. The optical sensor according to claim 1, wherein the upper substrate includes a light-transmitting sealing layer and a light-transmitting substrate laminated on the sealing layer in this order from the lower substrate side.

5. The optical sensor according to claim 1, further comprising a conductive layer electrically connecting the upper electrode to the lower substrate, wherein a distance between the conductive layer and the upper electrode is equal to a distance between the lower electrode and the hole transport layer in a cross-sectional view.

6. The optical sensor according to claim 1, further comprising an auxiliary electrode film that is provided between each of the plurality of lower electrodes and the hole transport layer so as to be in contact with the hole transport layer and overlap with each of the plurality of lower electrodes in a plan view.

7. A method for manufacturing an optical sensor, the method comprising the steps of:

forming a light-transmitting conductive layer on a light-transmitting first substrate;

forming an organic photoelectric conversion layer on the light-transmitting conductive layer, the organic photoelectric conversion layer including an electron transport layer, an active layer, and a hole transport layer in this order from the first substrate side, bonding the first substrate to the second substrate, on which the plurality of electrodes are provided, with a conductive adhesive so as to electrically connect each of the plurality of electrodes to the organic photoelectric conversion layer, wherein an end portion of the electron transport layer is located closer to an end portion of the lower substrate than an end portion of the active layer, and the end portion of the active layer is located closer to the end portion of the lower substrate than an end portion of the hole transport layer.

* * * * *